United States Patent
Abbott et al.

(10) Patent No.: US 8,338,275 B2
(45) Date of Patent: Dec. 25, 2012

(54) METHODS OF FORMING A METAL CONTACT ON A SILICON SUBSTRATE

(75) Inventors: Malcolm Abbott, San Jose, CA (US); Daniel Kray, Freiburg (DE)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 13/172,035

(22) Filed: Jun. 29, 2011

(65) Prior Publication Data

US 2012/0058632 A1    Mar. 8, 2012

Related U.S. Application Data

(60) Provisional application No. 61/360,414, filed on Jun. 30, 2010.

(51) Int. Cl.
*H01L 21/20* (2006.01)
*B82Y 30/00* (2011.01)

(52) U.S. Cl. ........ 438/478; 977/773; 438/542; 438/597; 438/694; 257/E21.135

(58) Field of Classification Search .......... 438/478–479, 438/542, 597, 717, 719; 977/855–859, 888
See application file for complete search history.

(56) References Cited

U.S. PATENT DOCUMENTS

| | | |
|---|---|---|
| 7,521,340 B2 | 4/2009 | Lemmi et al. |
| 7,851,336 B2 | 12/2010 | Poplavskyy et al. |
| 7,998,359 B2 | 8/2011 | Rogojina et al. |
| 2007/0167019 A1 | 7/2007 | Zurcher et al. |
| 2007/0221611 A1 | 9/2007 | Chow et al. |
| 2008/0153242 A1 | 6/2008 | Daniel et al. |
| 2010/0009488 A1 | 1/2010 | Sivaram et al. |
| 2010/0167510 A1 | 7/2010 | Kelman et al. |
| 2011/0003465 A1 | 1/2011 | Scardera et al. |

*Primary Examiner* — Savitr Mulpuri
(74) *Attorney, Agent, or Firm* — Foley & Lardner LLP

(57) ABSTRACT

A method of forming a metal contact on a silicon substrate is disclosed. The method includes depositing a nanoparticle ink on a substrate surface in a pattern, the nanoparticle ink comprising set of nanoparticles and a set of solvents. The method also includes heating the substrate in a baking ambient to a first temperature and for a first time period in order to create a densified nanoparticle layer with a nanoparticle layer thickness of greater than about 50 nm. The method further includes depositing an $SiN_x$ layer on the substrate surface, $SiN_x$ layer having a $SiN_x$ layer thickness of between about 50 nm and about 110 nm; exposing the substrate to an etchant that is selective to the densified nanoparticle layer for a second time period and at a second temperature in order to create a via; and forming a metal contact in the via, wherein an ohmic contact is formed with the silicon substrate.

18 Claims, 9 Drawing Sheets

METHODS OF FORMING A METAL CONTACT ON A SILICON SUBSTRATE

CROSS-REFERENCE TO RELATED APPLICATIONS

This application claims priority from U.S. Provisional Application No. 61/360,414, filed Jun. 30, 2010, the entire contents of which are incorporated herein by reference.

FIELD OF DISCLOSURE

This disclosure relates in general to ohmic contact formation and in particular to methods of patterning a structural layer on a silicon solar cell.

BACKGROUND

A solar cell converts solar energy directly to DC electric energy. Generally configured as a semiconductor photodiode, a solar cell permits light to be absorbed in the semiconductor resulting in generation of charge carriers (electrons and holes) which are then extracted as electrical current. Usually, photodiodes are formed by combining p-type and n-type semiconductors to form a p-n junction.

Electrons on the p-type side of the junction within the electric field (or built-in potential) tend to be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration (e.g., phosphorous, arsenic, antimony, boron, aluminum, gallium, etc.) often shown as n−, n+, n++, p−, p+, p++, etc. The built-in potential and thus magnitude of electric field generally depend on the level of doping between two adjacent layers.

In general, typical solar cells are formed on a silicon substrate doped with a first dopant (the absorber region), upon which a second counter dopant is diffused using a gas or liquid process (the emitter region) completing the p-n junction. After the addition of passivation and antireflection coatings, metal contacts (fingers and busbar on the emitter, and pads on the back of the absorber) may be added in order to extract generated charge. Emitter dopant concentration, in particular, must be optimized for both carrier collection and for contact with the metal electrodes.

Referring now to FIG. 1, a simplified diagram of a traditional front-contact solar cell is shown. In a common configuration, a counter doped emitter region 108 (n-type or p-type) is first formed on a lightly doped silicon substrate 110 (p-type or n-type respectively). Prior to the deposition of silicon nitride ($SiN_x$) layer 104 on the front of the substrate, residual surface glass formed on the substrate surface during the deposition process) is substantially removed (PSG in the case of $POCl_3$ or $H_3PO_4$, and BSG in the case of $BBr_3$) commonly by exposing the silicon substrate to hydrofluoric acid (HF). The set of metal contacts, comprising front-metal contact 102 and back surface field (BSF)/back metal contact 116, are then sequentially formed on and subsequently fired into silicon substrate 110.

The front metal contact 102 is commonly formed by depositing an Ag (silver) paste, comprising Ag powder (about 70 wt % to about 80 wt % (weight percent)), lead borosilicate glass (frit) PbO—$B_2O_3$—$SiO_2$ (about 1 wt % to about 10 wt %), and organic components (about 15 wt % to about 30 wt %). After deposition the paste is dried at a low temperature to remove organic solvents and fired at high temperatures to form the conductive metal layer and to enable the silicon-metal contact. During the firing process, as the temperature is increased up to about 400° C., the frit softens and forms a molten glass which wets and dissolves the underlying anti-reflective coating (e.g., silicon nitride) barrier layer 104 layer in an exothermal redox reaction. During the cooling phase the glass solidifies and silver crystallites tend to form in the layer. These silver crystallites have been shown to form ohmic contact to the underlying silicon and allow conduction through the insulating glass layer.

The formation of these crystals is strongly dependent on the firing temperature and on the underlying doping of the silicon. If the firing temperature and/or dopant concentration is too low then not enough crystals form and the contact has high resistance. If the temperature is too high then the crystals may become too big, penetrate the junction and form an alternative path for current to flow instead of through the external load. This is commonly referred to as a shunt resistance. Over firing (i.e., too hot for too long) may also result in the formation of a glass layer that is too thick. In this case a high resistance contact is formed as the carriers are unable to pass easily through the glass and into the silver electrode. The need to form a glass layer of appropriate thickness with the correct size and number of crystallites creates a narrow process window which compromises the efficiency. In addition to this problem, the presence of glass frit within the metal finger may reduce the conductivity of the finger, adding to the overall series resistance of the solar cell.

BSF/back metal contact 116 is generally formed (from aluminum in the case of a p-type wafer), and is configured to create an electrical field that repels and thus minimizes the impact of minority carrier rear surface recombination. In addition, Ag pads [not shown] are generally applied onto BSF/back metal contract 116 in order to facilitate soldering for interconnection into modules. During the firing process it is often beneficial to use higher temperatures for longer times since this will incorporate more dopant atoms to form the BSF. However, the need to correctly fire the front silver contacts often compromises the ideal firing conditions.

In view of the foregoing, there is a desire to provide optimized methods of forming a metal contact on a silicon substrate.

SUMMARY

The invention relates, in one embodiment, to a method of forming a metal contact on a silicon substrate is disclosed. The method includes depositing a nanoparticle ink on a substrate surface in a pattern, the nanoparticle ink comprising a set of nanoparticles and a set of solvents. The method also includes heating the substrate in a baking ambient to a first temperature and for a first time period in order to create a densified nanoparticle layer with a nanoparticle layer thickness of greater than about 50 nm. The method further includes depositing an $SiN_x$ layer on the substrate surface, $SiN_x$ layer having a $SiN_x$ layer thickness of between about 50 nm and about 110 nm; exposing the substrate to an etchant that is selective to the densified nanoparticle layer for a second time period and at a second temperature in order to create a via; and forming a metal contact in the via, wherein an ohmic contact is formed with the silicon substrate.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
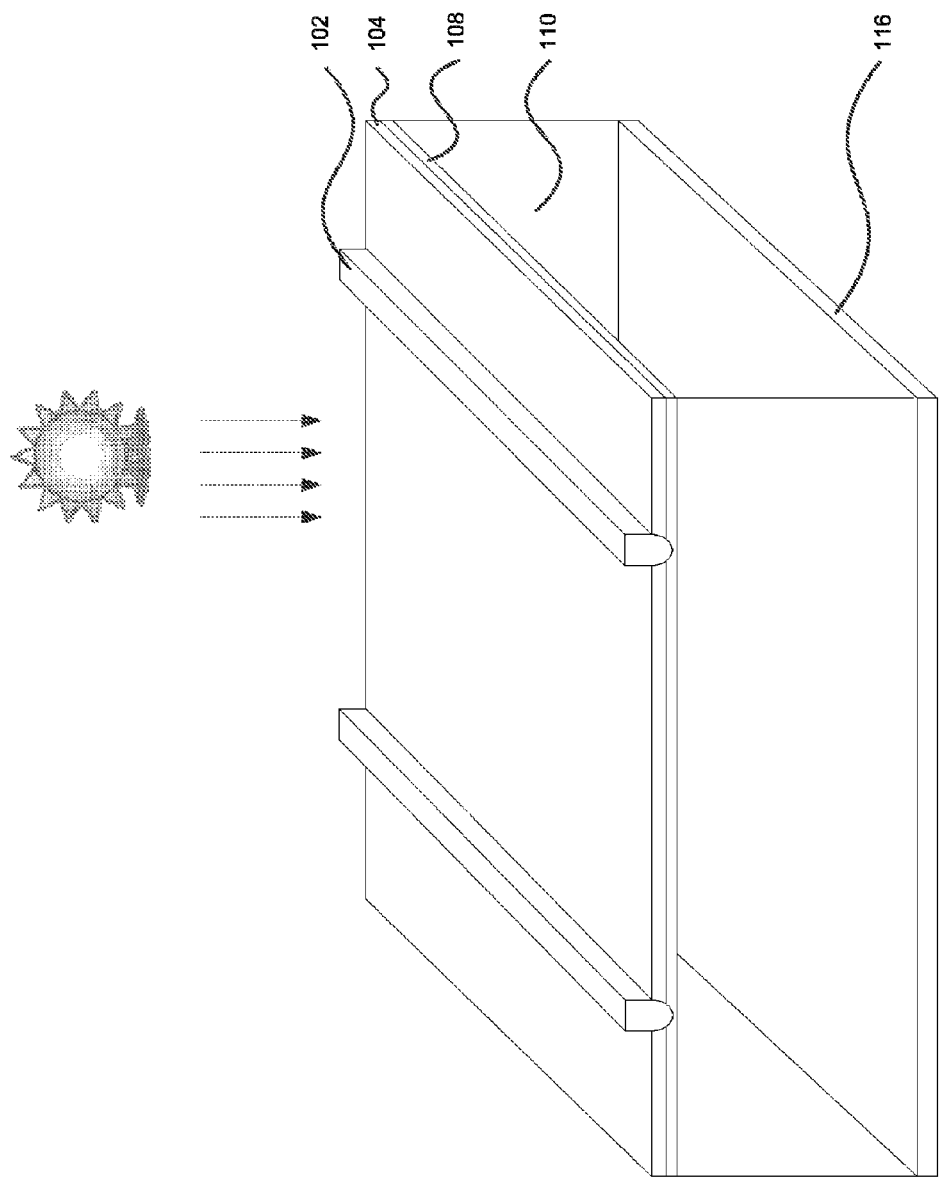
FIG. 1 shows a simplified diagram of a traditional front-contact solar cell.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously stated, common methods of forming metal contacts may be problematic, causing compromises to solar cell efficiency and having potential of high resistance contacts or the introduction of parasitic loss mechanisms such as shunting. In an advantageous manner, a dielectric/passivation layer, such as $SiN_x$, may be deposited on a silicon substrate surface partially patterned with a set of nanoparticles, such that portions of the dielectric/passivation layer over the set of particles are substantially more selective to cleaning/etching processes than areas without deposited particles. In addition to this, the particles may also be used to form heavily doped regions in the silicon. This combination allows the formation of low resistance contacts without the need to compromise the formation of the BSF or emitter.

In general, a dielectric layer, such as $SiN_x$, is deposited using a plasma enhanced chemical vapor deposition (PECVD) process. A plasma is any gas in which a significant percentage of the atoms or molecules are ionized. In PECVD, a plasma is generally created by RF (AC) frequency or DC discharge between two electrodes (typically a top electrode/showerhead and a bottom electrode), the space between which is filled with the reacting gases. When high-density plasma is used, the ion density can be high enough that significant sputtering of the deposited film occurs; this sputtering can be employed to help planarize the film over non-planar substrate surfaces. For $SiN_x$, the reactions are generally one of:

$$3\, SiH_4 + 4\, NH_3 \rightarrow Si_3N_4 + 12\, H_2 \quad \text{[EQUATION 1]}$$

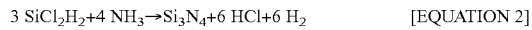

$$3\, SiCl_2H_2 + 4\, NH_3 \rightarrow Si_3N_4 + 6\, HCl + 6\, H_2 \quad \text{[EQUATION 2]}$$

Deposition is usually performed in showerhead configuration PECVD reactors, operating at from a few hundred mTorr to a few Torr. Temperatures of 250 to 400° C. are typically employed.

As $SiN_x$ is deposited on a non-planar substrate surface, $SiN_x$ film tends to accumulate on surface areas parallel to the bottom electrode in comparison to surface areas perpendicular to the bottom electrode (which tend to be thinner). However, as more $SiN_x$ is deposited, the $SiN_x$ film tends to conformally coat and strongly adhere to the topology of the substrate surface.

In contrast, the inventors believe that it is difficult to deposit a conformal film on a set of sintered sub-micron particles because of the substantially greater amount of exposed particle surface area. While not wishing to be bound by theory, the inventors believe that by first depositing the set of nanoparticles in a pattern on the silicon substrate, and depositing a $SiN_x$ film on the silicon substrate, and then exposing the silicon substrate surface to an etchant that is selective such that the etch rate is high for the sub-micron particles, but low for the $SiN_x$, a set of channels will be formed exposing the underlying substrate matching the deposited pattern. For example, under certain conditions silicon containing particles are etched faster in KOH, while the etch rate of $SiN_x$ is much slower.

To achieve selective etching that is useful in solar cell fabrication, it is generally necessary for the thickness of the nanoparticle layer and the nitride layer to be within certain ranges. Also the nanoparticle layer should consist of particles with a size distribution whose median value is between about 10 nm and about 500 nm, more preferably between about 10 nm and about 300 nm, and most preferably between about 10 nm and about 200 nm.

In general, in comparison to a given first thickness of a deposited $SiN_x$ layer (as measured from the substrate surface), a second thickness of a deposited densified nanoparticle layer enables selective etching when the second thickness is greater than the first thickness.

In one configuration, the thickness of the densified nanoparticle layer (second thickness) immediately prior to $SiN_x$ deposition should be greater than 50 nm, preferably between 50 nm and 1 um, more preferably between 100 nm and 500 nm, and most preferably between 200 nm and 300 nm.

In addition, the thickness of the $SiN_x$ layer when used on the front surface should generally be chosen for optimal anti-reflection properties. In this case the ideal thickness after the selective etching process should be between about 90 nm and about 110 nm for a RI (reflective index) of between 2.0 and 2.1 when used on random pyramid texture or a thickness of between about 60 nm and about 80 nm when used on an isotextured surface. When used on the rear side, the nitride thickness should be between about 20 nm and about 150 nm or more preferably between 50 nm and 100 nm.

In general, the nanoparticle material used to enable selective etching should be a material which can be etched without detrimentally affecting the $SiN_x$ layer or the underlying crystalline silicon. In addition, the etchants used are also dependent on the nano material used. For example, for silicon containing nanoparticles, etchants such as KOH or NaOH (with or without the addition of IPA) may be used for selective etching. In general, the etch concentration of KOH or NaOH should be less than about 50%, and more preferably between about 20% and about 30%. The concentration of IPA, if used, should be between about 0% and about 5%. The temperature of the selective etching should be between about 20° C. and about 80° C. or more preferably between about 40° C. and about 60° C. The time of the etch should be between about 2 minutes and about 30 minutes, and more preferably between about 5 minutes and about 10 minutes.

In an alternate configuration, the nanoparticle material may contain silicon dioxide particles. In this configuration, the selective etching may be done using HF chemistries. In general, when using HF to achieve selective etching, it may be necessary for the SiN$_x$ to be thicker (first thickness as previously described) before etching to allow for some thinning of this layer during the etch.

In general, for selective etching of nanoparticle material with silicon dioxide particles, the concentration of the HF should be between about 2% and about 10%, and more preferably 5%. The temperature of the selective etch should be between about 10° C. and about 30° C., and more preferably between about 20° C. and about 25° C. The time of the HF etch should be between about 1 minute and about 10 minutes, and more preferably between about 2 minutes and about 5 minutes.

In the case of a front-side metal contact, an Ag paste may be used without frit (or with a very low frit content) to contact to the underlying substrate through the channels defined by the selective etching. In the case of a back metal contact, SiN$_x$ may also be used to passivate the rear surface with relatively small meal contacts (Al and/or Ag) instead of a full area metal contact. In both cases it may also be possible to use self aligned metallization technique by using a selectively etched SiN$_x$ layer as a mask, depositing the metal into exposed areas of the silicon substrate below the SiN$_x$ layer. Examples of this include electro-plating (electroless, light induced, etc) of metals such as Ni, Cu, Ag and Sn.

Additionally, prior to the selective etching step, the layer of particles may be used to form a heavily doped region. Examples may be seen in U.S. patent application Ser. No. 12/626,198, filed Nov. 25, 2009, entitled Methods of Using a Set of Silicon Nanoparticle Fluids To Control In Situ a Set of Dopant Diffusion Profiles, and U.S. patent application Ser. No. 12/656,710, filed Feb. 12, 2010, entitled Methods of Forming a Multi-Doped Junction with Silicon-Containing Particles, both of which are incorporated by reference.

In general, because of their small size, sub-micron particles tend to be difficult to manipulate. Consequently, in an advantageous manner, the sub-micron particles may be suspended in a colloidal dispersion or colloid, such as an ink, in order to transport, store, and deposit the particles. Generally, colloidal dispersions of sub-micron particles are possible because the interaction of the particle surface with the solvent is strong enough to overcome differences in density, which usually result in a material either sinking or floating in a liquid. That is, smaller nanoparticles disperse more easily than larger nanoparticles.

In general, the use of particle dispersal methods and equipment such as sonication, high shear mixers, and high pressure/high shear homogenizers may be used to facilitate dispersion of the sub-micron particles in a selected solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse sub-micron particles in the colloidal dispersion (ink), nanoparticle capping groups may be formed with the addition of organic compounds, such as alcohols, aldehydes, ketones, carboxylic acids, esters, and amines, as well as organosiloxanes.

EXPERIMENT 1

Figure 2:
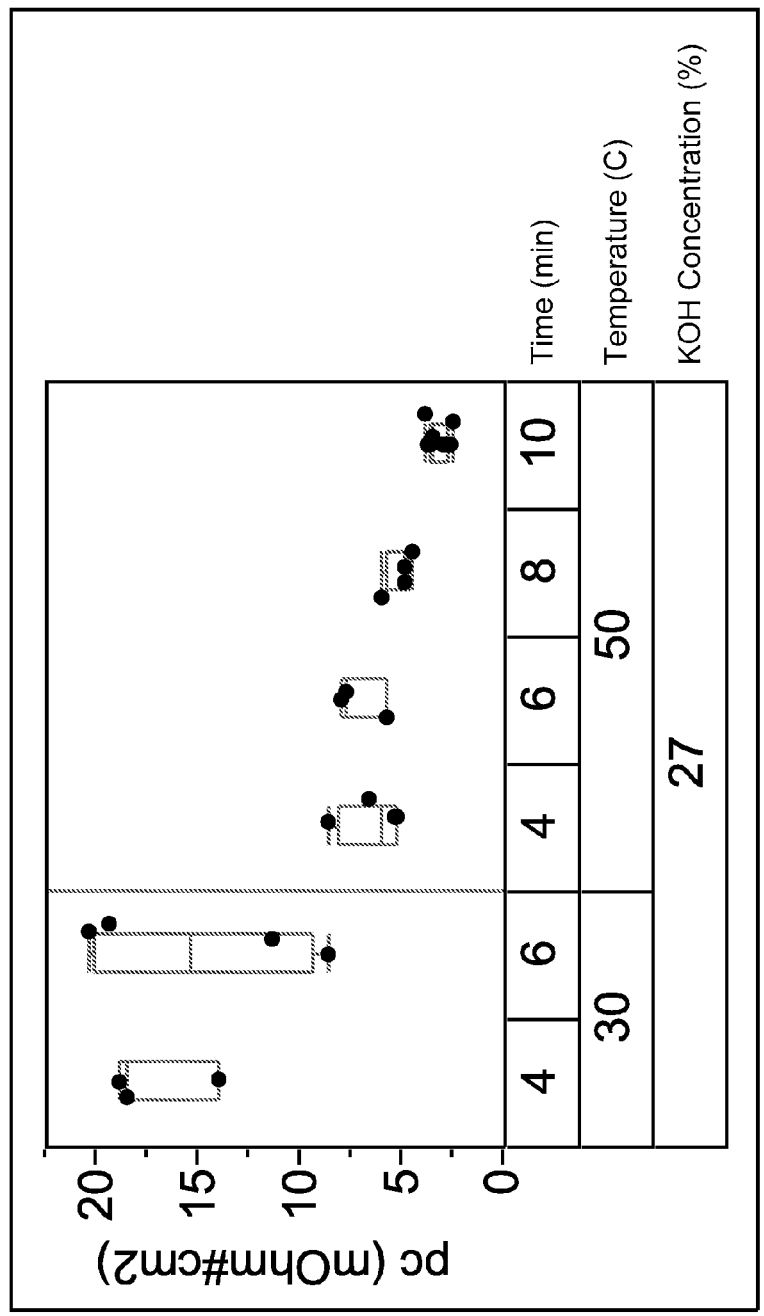
FIG. 2 shows a simplified diagram comparing different etching conditions on the formation of an ohmic metal contact to a diffused n-type silicon layer.

Referring now to FIG. 2, a simplified diagram is shown comparing different etching conditions on the formation of an ohmic metal contact to a diffused n-type silicon layer.

All samples were prepared on p-type, 1-3 Ohm-cm CZ (Czochralski) silicon wafers. The surface of the wafers were first etched in HF:HNO$_3$ (to remove residual saw damage) and then textured with the upright random pyramid process (KOH:IPA). After texturing the substrates were cleaned in a mixture of HF:HCl prior to ink deposition A nanoparticle ink pattern was then deposited on each substrate using a conventional screen printer in an H-bar pattern (i.e., two 1.6 mm wide busbars with eighty evenly spaced 180 um wide fingers at right angles). After ink printing, the samples were heated to about 550° C. for about 12 minutes in order to densify the nanoparticle ink and remove residual solvents, and then the samples were cleaned in HF for about 2 minutes prior to diffusion.

Subsequently, the samples were loaded into a quartz tube furnace and processed with POCl$_3$ doping gas at about 800° C. for about 20 minutes followed by a ramp to 900° C. in oxygen and a drive-in at about 900° C. for about 40 minutes in nitrogen. Measurements show that an 80-100 Ohm/sq field emitter with 30-60 Ohm/sq is formed under the densified ink regions. In addition, all substrates were loaded and unloaded at 800° C. in nitrogen.

PSG, formed as part of the POCl$_3$ diffusion process, was then removed using a 2 minute HF process, followed by a PECVD deposition of SiN$_x$ with a refractive index (RI) of 1.98 and a thickness of 115 nm (as measured using an elipsometer on a polished sample run through the same deposition)

Vias for the subsequent metal contacts where then formed over the densified nanoparticle ink pattern by exposing the substrates to a 27% solution of KOH at a variety of temperatures and times as shown in the figure.

After etching the substrates were rinsed in DI water, cleaned in 1:1:100 HCl:H$_2$O$_2$:H$_2$O to remove residual etchant material, and then rinsed in DI water and dried with nitrogen. Afterwards, the substrates were screen printed with an H-bar pattern of low fitted silver paste using a conventional screen printer. The deposited Ag pattern was aligned such that it sat on top of the formed vias. The substrates were then fired in a belt furnace at 750° C. with 4 seconds over 700° C.

After firing, the substrates were cut into 5 mm wide strips and characterized with TLM (transmission line measurements) to extract the specific contact resistivity. As can be seen, the specific contact resistivity is reduced with increasing etch temperature and increasing etch time. The inventors believe that further optimization of the etch conditions will lead to even lower values of specific contact resistivity.

Visual observations of the samples after KOH etching identified that different amounts of SiN$_x$ were removed from the surface in the ink regions. Samples processed at the lower temperature conditions were generally darker in the ink regions with noticeably more nitride remaining on the surface. At the higher temperature as the time was increased the ink printed regions become grey/silver coloured as the underlying silicon becomes exposed. By contrast the SiN$_x$ region in non-ink printed regions was unchanged with no noticeable shift in the color (which would indicate a thinning of the layer thickness). The inventors believe that for the most active etch conditions, although all of the silicon nano-particle ink was removed, the reduction in SiN$_x$ thickness was less than 1 nm.

EXPERIMENT 2

Figure 3A:
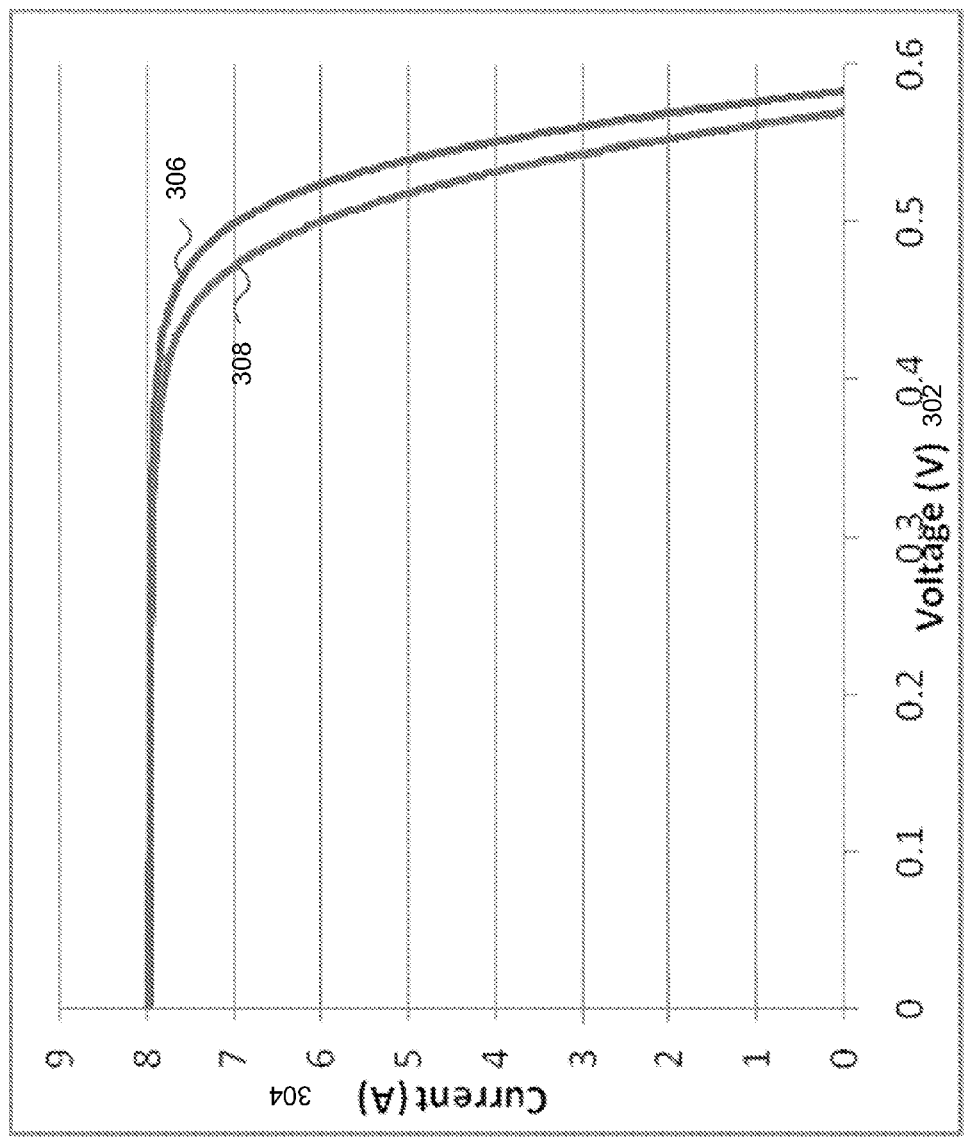
FIGS. 3A-C show a simplified set of diagrams of the effect of different etching conditions on the formation of ohmic contacts to a diffused n-type silicon layer, in accordance with the invention.
Figure 3B:
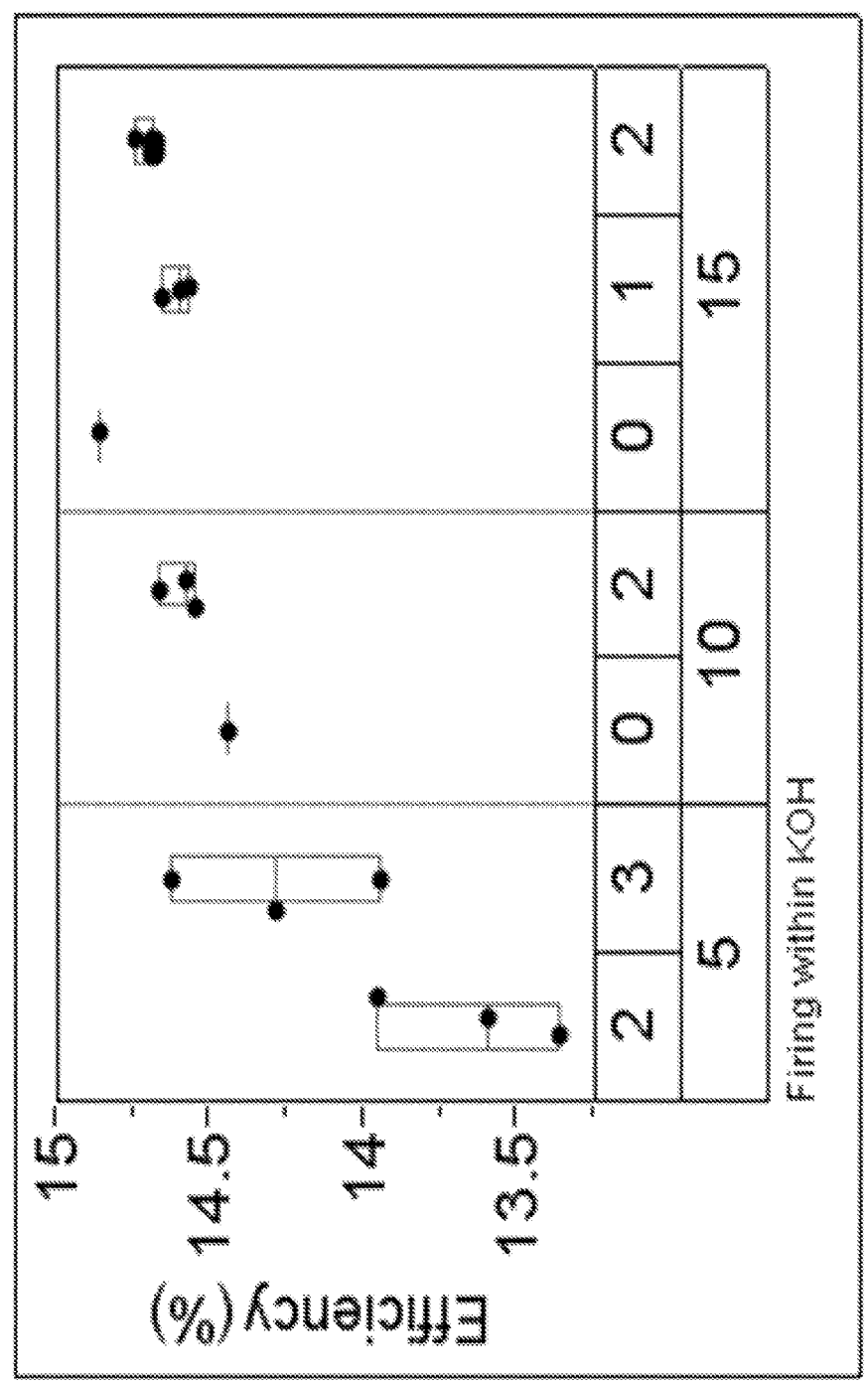
Figure 3C:
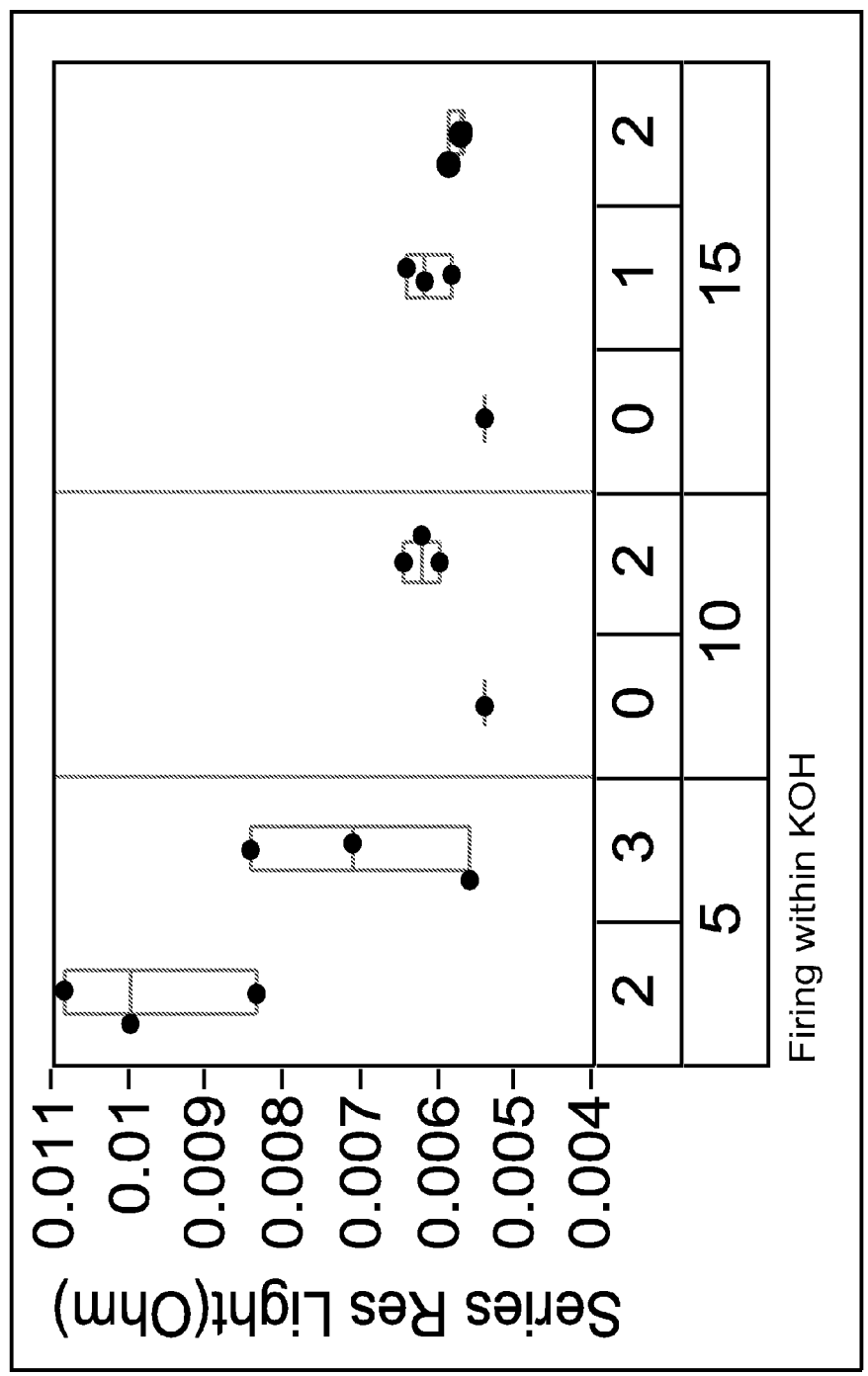

Referring now to FIGS. 3A-C, a simplified set of diagrams showing the effect of different etching conditions on the formation of ohmic contacts to a diffused n-type silicon layer, in accordance with the invention.

All substrates were prepared on p-type, 1-3 Ohm-cm CZ silicon wafers. The surface of the substrates were first etched in HF:$HNO_3$ (to remove residual saw damage) then textured with the upright random pyramid process (KOH:IPA).

After texturing the substrates were cleaned in HF:HCl before being loaded into a quartz diffusion tube. An n-type layer was diffused onto front and rear side of the samples using $POCl_3$ at 850° C. for 15 minutes, forming an n-type diffusion on both surfaces with a sheet resistance of 50-60 Ohm/sq. After diffusion, the PSG layer was removed using HF for 2 minutes.

A nanoparticle ink pattern was then deposited on each substrate using a conventional screen printer in an H-bar pattern (i.e., two 1.6 mm wide busbars with eighty evenly spaced 180 um wide fingers at right angles). After printing, the substrates were baked for about 12 minutes in a quartz tube at 550° C., followed by 2 minutes in HF and PECVD $SiN_x$ on front and rear side.

Vias for the subsequent metal contacts where then formed over the deposited nanoparticle ink pattern by exposing the substrates to a 30% KOH solution at about 50-55° C. for 5, 10 and 15 minutes respectively. As in FIG. 2, the $SiN_x$ layer was not affected by this etching. The cells were then finished by screen printing a silver pattern (with frit) on the front side and a full area aluminum layer on the rear side. The samples were fired in a conventional belt furnace with three different temperature profiles. The resulting solar cells were characterized using a HALM IV flash tester. Values for series resistance were extracted by comparing IV curves made at 1-Sun and at 0.2-Suns respectively.

As can be seen, the processed substrates generally show good rectifying behavior as evidenced by the shape of the light IV curves. The value of series resistance of 6 mOhm is quite low, particularly given the non-optimized nature of the rear contact pattern. In general, the overall efficiency is low due to poor Voc and Jsc caused by the shunting of the rear-side floating junction, leading to efficiency values between 13.5% and 15%.

Referring now to FIGS. 4A-G, a simplified set of diagrams showing an optimized method for forming a metal contact on a substrate, wherein the particles are deposited after formation of a diffused region, in accordance with the invention.

Figure 4A:
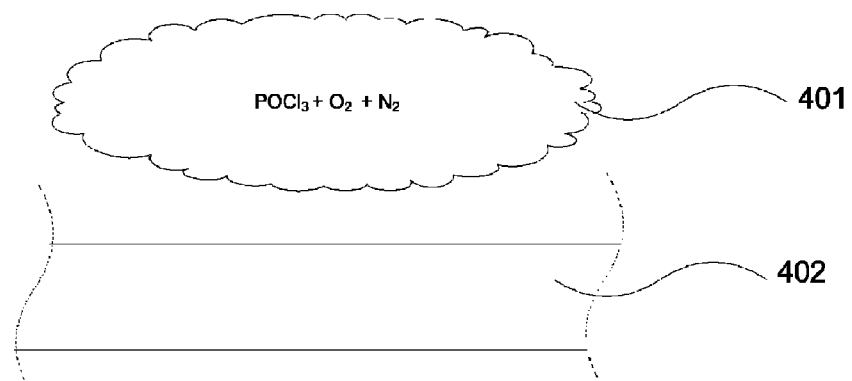
FIGS. 4A-G show an optimized method for forming a metal contact on a substrate, wherein the particles are deposited after formation of a diffused region, in accordance with the invention; and, FIGS. 5A-G show an optimized method for forming a metal contact on a substrate, wherein the particles are deposited prior to the formation of a diffused region, in accordance with the invention.

In FIG. 4A, a doped silicon substrate 402 is exposed to a diffusion source. For example, in one configuration, in the case of a boron doped substrate, the substrate is heated to diffusion temperature (preferably between about 700° C. and about 1000° C. and between about 5 minutes and about 30 minutes, more preferably between about 750° C. and about 850° C. and for between 10 and 20 minutes, and most preferably about 800° C. and for about 15 minutes, during which time, nitrogen is flowed as a carrier gas through a bubbler filled with a low concentration liquid $POCl_3$ (phosphorus oxychloride), $O_2$ gas, and $N_2$ gas in order to form a processing gas 430.

Figure 4B:
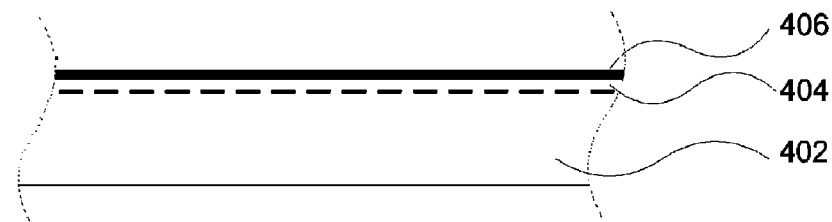

In FIG. 4B, as the thermal process as shown in FIG. 4A continues, dopants in the diffusion source diffuse into doped substrate 402 to form diffusion layer 404 and glass layer 406. For example, $O_2$ molecules react with $POCl_3$ molecules to form front PSG layer 432 and rear PSG layer 434, both comprising $P_2O_5$ (phosphorus oxide), on p-doped silicon substrate 402. As the chemical process continues, phosphorus diffuses into the silicon wafer to form a front n-doped low concentration area 404. A second thermal step is used to drive dopant atoms into the substrate. The furnace chamber is heated to a temperature (preferably between about 800° C. to about 1000° C., more preferably between about 850° C. and 900° C., and most preferably at about 875° C.) for between about 5 minutes and 30 minutes.

Figure 4C:
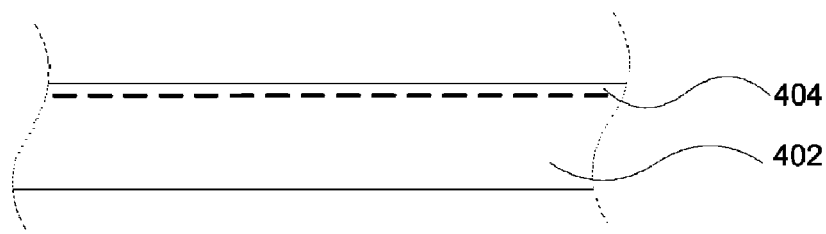

In FIG. 4C, glass layer 406 may be removed using a batch HF wet bench or other suitable means.

Figure 4D:
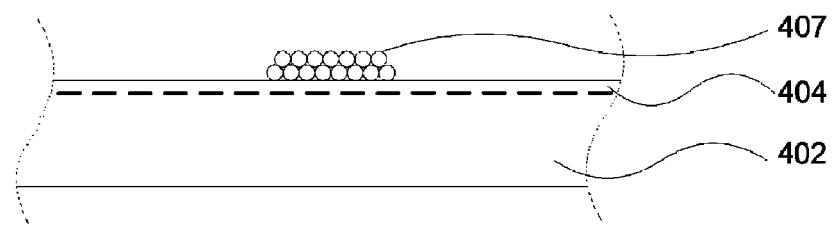

In FIG. 4D, particle layer 407 is deposited on the surface of doped substrate 402 using application methods such as roll coating, slot die coating, gravure printing, flexographic drum printing, inkjet printing methods, etc. After deposition, doped substrate 407 may be baked in order to remove residual solvents at a first baking temperature (preferably from about 100° C. to about 500° C., more preferably between about 200° C. and about 400° C., and most preferably about 250° C.). Baking may be performed in an air ambient or in an inert ambient such as with a nitrogen gas, argon gas or forming gas.

Figure 4E:
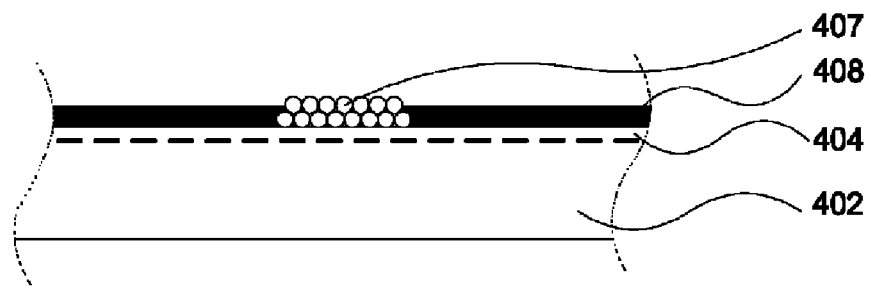

In FIG. 4E, a dielectric layer 408 (such as $SiN_x$) is deposited over doped substrate 402 and deposited particles 407, such that deposited particles 407 are only partially covered by the dielectric coating.

Figure 4F:
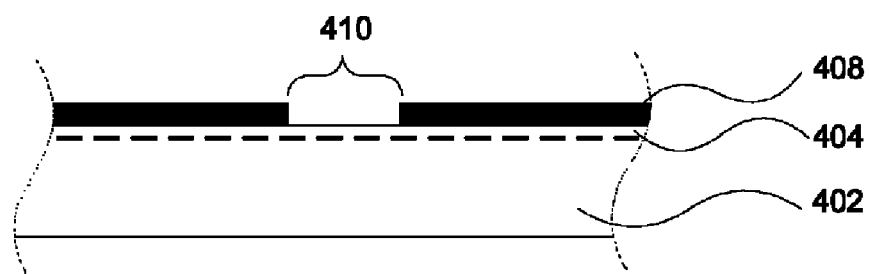

In FIG. 4F, the doped substrate is exposed to an etchant that is selective to deposited particles 407, such as KOH, wherein a channel is created in dielectric layer 408 over emitter layer 404.

Figure 4G:
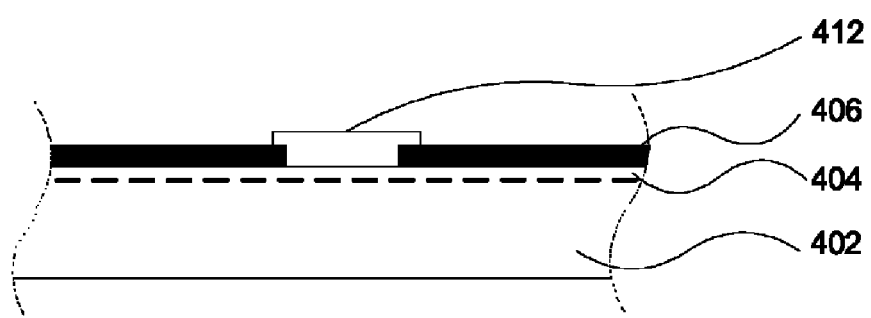

In FIG. 4G, a metal contact is formed with an Ag paste without frit or paste with a low frit content or using electroplating techniques as known in the art.

Referring now to FIGS. 5A-G, a simplified set of diagrams showing an optimized method for forming a metal contact on a substrate, wherein the particles are deposited after formation of a diffused region, in accordance with the invention.

Figure 5A:
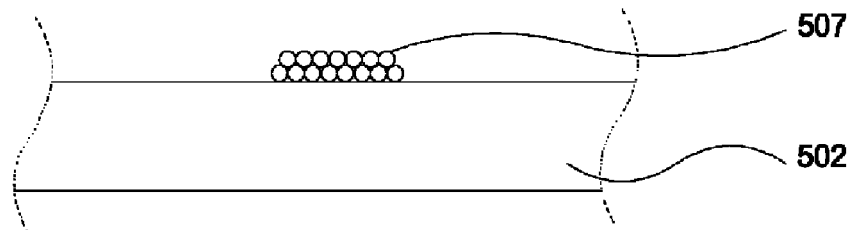

In FIG. 5A, Prior to phosphorous dopant diffusion, a set of silicon particle ink patterns 507 is deposited on the front substrate surface in order to subsequently create ohmic contacts. Particle layer 507 is deposited on the surface of doped substrate 502 using application methods such as roll coating, slot die coating, gravure printing, flexographic drum printing, inkjet printing methods, etc. After deposition, doped substrate 502 may be baked in order to remove residual solvents at a first baking temperature (preferably from about 100° C. to about 500° C., more preferably between about 200° C. and about 400° C., and most preferably about 250° C.). Baking may be performed in an air ambient or in an inert ambient such as with a nitrogen gas, argon gas or forming gas.

Figure 5B:
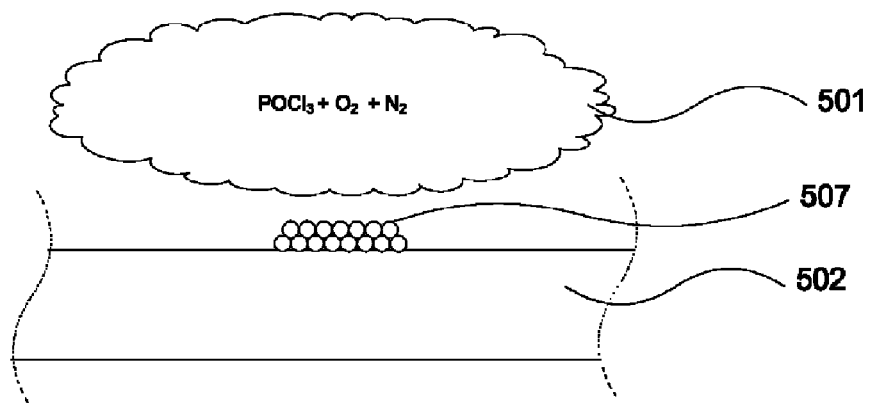

In FIG. 5B, doped silicon substrate 502 is exposed to a diffusion source. For example, in one configuration, in the case of a boron doped substrate, the substrate is heated to diffusion temperature (preferably between about 700° C. and about 1000° C. and between about 5 minutes and about 30 minutes, more preferably between about 750° C. and about 850° C. and for between 10 and 20 minutes, and most preferably about 800° C. and for about 15 minutes) during which time, nitrogen is flowed as a carrier gas through a bubbler filled with a low concentration liquid $POCl_3$ (phosphorus oxychloride), $O_2$ gas, and $N_2$ gas in order to form a processing gas 501.

Figure 5C:
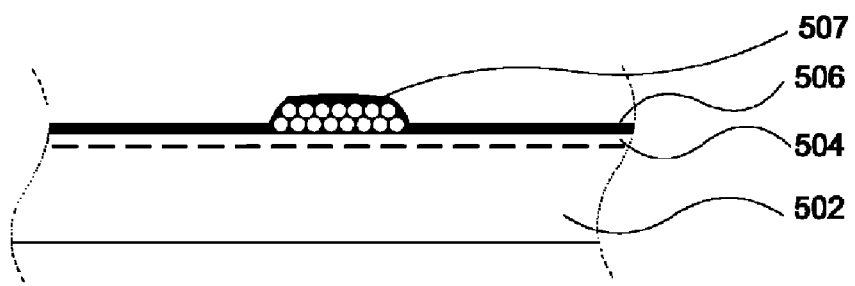
Figure 5D:
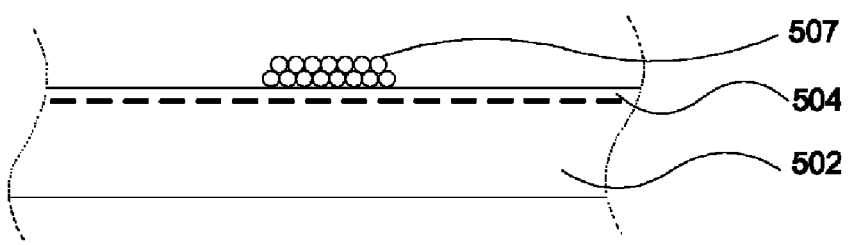

In FIGS. 5C and 5D after diffusion the PSG layer may be removed using a batch HF wet bench or other suitable means.

Figure 5E:
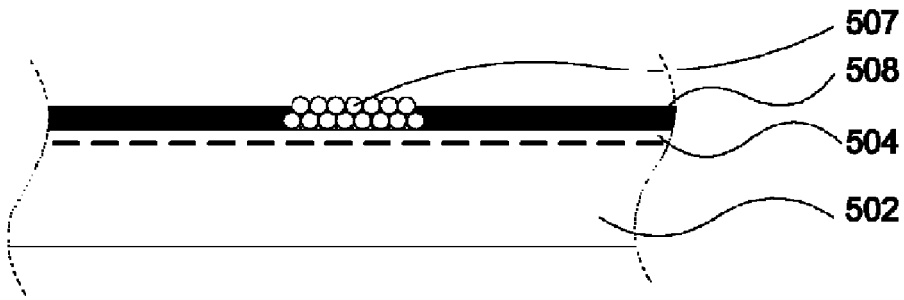

In FIG. 5E, a dielectric layer 508 (such as $SiN_x$) is deposited over doped substrate 502 and deposited particles 507, such that deposited particles 507 are only partially covered by the dielectric coating.

Figure 5F:
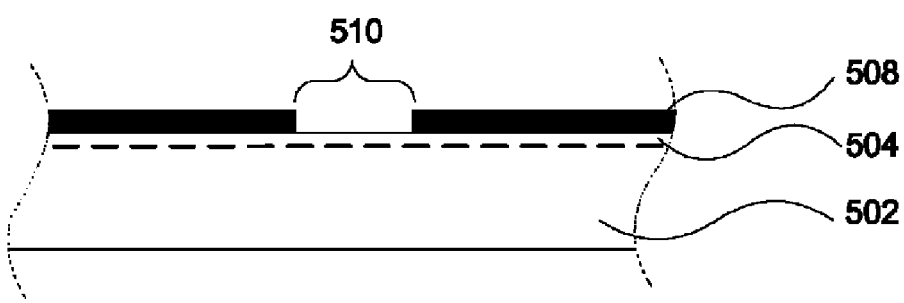

In FIG. 5F, the doped substrate is exposed to an etchant that is selective to deposited particles 507, such as KOH, wherein a channel is created in dielectric layer 508 over emitter layer 504.

Figure 5G:
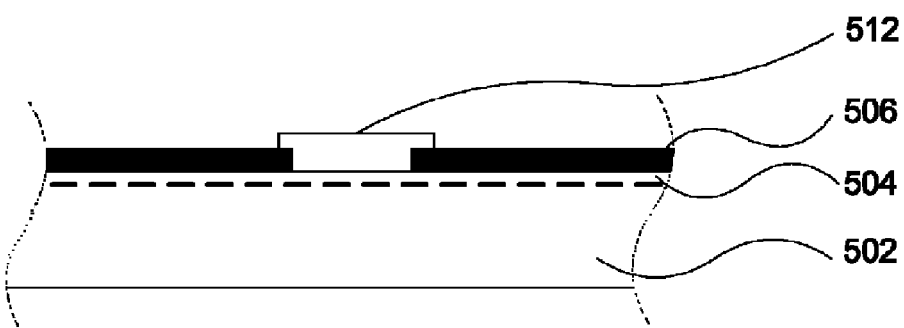

In FIG. 5G, a metal contact is formed with an Ag paste without frit or paste with a low frit content or using electroplating techniques.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the silicon substrate may be either mono-crystalline or multi-crystalline.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include methods of forming a metal contact on a silicon substrate.

Having disclosed exemplary embodiments and the best mode, modifications and variations may be made to the disclosed embodiments while remaining within the subject and spirit of the invention as defined by the following claims.

What is claimed is:

1. A method of forming a metal contact on a silicon substrate, comprising:
   depositing a nanoparticle ink on a substrate surface in a pattern, the nanoparticle ink comprising a set of nanoparticles and a set of solvents;
   heating the substrate in a baking ambient to a first temperature and for a first time period in order to create a densified nanoparticle layer with a nanoparticle layer thickness of greater than about 50 nm;
   depositing an $SiN_x$ layer on the substrate surface, $SiN_x$ layer having a $SiN_x$ layer thickness of between about 50 nm and about 110 nm;
   exposing the substrate to an etchant that is selective to the densified nanoparticle layer for a second time period and at a second temperature in order to create a via; and
   forming a metal contact in the via, wherein an ohmic contact is formed with the silicon substrate.

2. The method of claim 1, wherein the nanoparticle layer thickness is between about 100 nm and about 500 nm.

3. The method of claim 1, wherein the nanoparticle layer thickness is between about 200 nm and about 300 nm.

4. The method of claim 1, wherein the thickness of the $SiN_x$ layer is between about 60 nm and about 80 nm.

5. The method of claim 1, wherein the thickness of the $SiN_x$ layer is between about 50 nm and 100 nm.

6. The method of claim 1, wherein the silicon substrate is doped with phosphorous.

7. The method of claim 1, wherein the second temperature is between about 20° C. and about 80° C.

8. The method of claim 1, wherein the second temperature is between about 40° C. and about 60° C.

9. The method of claim 1, wherein the second time period is between about 2 minutes and about 30 minutes.

10. The method of claim 1, wherein the second period is between about 5 minutes and about 10 minutes.

11. The method of claim 1, further including the step of exposing the silicon substrate to a dopant source in a diffusion furnace with a deposition ambient, the deposition ambient comprising $POCl_3$ gas at a third temperature and for a third time period, wherein a PSG layer is formed on the substrate surface, prior to depositing an $SiN_x$ layer on the substrate surface.

12. The method of claim 11, wherein the third temperature is between about 700° C. and about 1000° C. and the third time period is between about 5 minutes and about 30 minutes.

13. The method of claim 11, wherein the third temperature is between about 750° C. and about 850° C. and the third time period is between about 10 minutes and about 20 minutes.

14. The method of claim 11, wherein the third time period is about 800° C. and the third time period is about 15 minutes.

15. The method of claim 1, wherein the nanoparticle ink comprises at least one of Si and $SiO_2$.

16. The method of claim 1, wherein the substrate surface is at least one of a front substrate surface and a rear substrate surface.

17. The method of claim 1, wherein the metal contact is formed using one of electroplating, a low frit content Ag paste, and Al paste.

18. The method of claim 1, wherein the etchant is at least one of KOH and NaOH.

* * * * *